United States Patent [19]

Nakamura et al.

[11] Patent Number: 4,472,654

[45] Date of Patent: Sep. 18, 1984

[54] PIEZOELECTRIC TUNING FORK VIBRATOR WITH REDUCED VIBRATIONAL LEAKAGE

[75] Inventors: Takeshi Nakamura; Hiroshi Nishiyama; Satoshi Matsuda; Tsutomu Okada, all of Kyoto, Japan

[73] Assignee: Murata Manufacturing Co., Ltd., Kyoto, Japan

[21] Appl. No.: 506,194

[22] Filed: Jun. 20, 1983

[30] Foreign Application Priority Data

Jun. 30, 1982 [JP] Japan .................................. 57-100189

[51] Int. Cl.³ .......................................... H01L 41/08
[52] U.S. Cl. ...................................... 310/321; 310/312
[58] Field of Search ................ 310/321, 322, 324, 312

[56] References Cited

U.S. PATENT DOCUMENTS 4,004,166 1/1977 Nakata ................................ 310/312
4,379,244 4/1983 Dinger ................................ 310/312
4,385,473 5/1983 Aoki et al. ...................... 310/312 X Primary Examiner—Mark O. Budd
Attorney, Agent, or Firm—Wenderoth, Lind & Ponack

[57] ABSTRACT

A piezoelectric tuning fork vibrator used as an oscillator or a detection element in various electronic circuits, which is provided at a vibrator body with a slit to form tuning fork legs at both sides, one leg at the vibrator having at the outside surface a piezoelectric thin film and an electrode thereon, so that the one leg including the piezoelectric thin film and electrode, is made equal in width to the other leg.

Hence, the both side tuning fork legs equal in width become equal in the resonance frequency and avoids leakage of vibration energy, whereby this piezoelectric vibrator is free from characteristic variation and has a high accuracy.

4 Claims, 3 Drawing Figures

Influence of Δω on Omission of Vibration

PIEZOELECTRIC TUNING FORK VIBRATOR WITH REDUCED VIBRATIONAL LEAKAGE

BACKGROUND OF THE INVENTION

This invention relates to an improvement in a piezoelectric tuning fork vibrator used as an oscillator or a detection element in various electronic circuits, and more particularly to a piezoelectric tuning fork vibrator of high accuracy and free from characteristic variation.

Conventionally, the piezoelectric tuning fork vibrator, as shown in FIG. 1, has a fundamental construction, in which a vibrator body 11 of an elasticity invariable material, such as elinvar, is provided with a slit 12 extending from one end to an intermediate portion of body 11 to form opposite tuning fork legs 13 and 14 at both sides thereof, one leg 13 being provided at the outside surface with a piezoelectric thin film 15, such as ZnO, and an electrode 16 on the film 15.

The piezoelectric tuning fork vibrator, as shown in FIG. 2, is supported by pin terminals 17 and 18 each welded at one end to one face of vibrator body 11 and embedded at the other end in a support member 19. The pin terminal 17 perforates the support member 19 and projects downwardly therefrom so as to be one electrical lead terminal and the electrode 16 is connected through a lead wire 20 to a terminal 21 perforating the support member 19 so as to be the other lead terminal.

In such a piezoelectric tuning fork vibrator, the tuning fork legs 13 and 14, when different in width, differ in the resonant frequency so as to cause omission of vibration (sound leakage) at the portion which supports the tuning fork vibrator.

The occurrence of omission of vibration makes the characteristics of the device unstable so that the resonant frequency varies due to the manner of support of the vibrator and the voltage build-up rate lowers, and as a result the vibrator is not suitable for an oscillator of high accuracy.

FIG. 3 shows the relation between a difference in width of the legs and the resonant frequency variation, in which the abscissa represents a difference $\Delta\omega$ in leg width and the ordinate represents the relative change in the resonant frequency.

The resonant frequency variation shown in FIG. 3, is the difference obtained by subtracting the resonant frequency of the piezoelectric tuning fork vibrator in a freely hanging condition B from that of the vibrator in a stationary condition A is divided by the latter resonant frequency.

Thus, it can be seen that the existence of a difference in width of the leg will cause the resonant frequency to vary approximately in proportion to the difference.

The conventional piezoelectric tuning fork vibrator has been machined to form both tuning fork legs 13 and 14 themselves equal in width before providing one leg 13 with the piezoelectric thin film 15 and electrode 16.

However, the legs 13 and 14, even if equal in width, become unbalanced to the extent of adding the piezoelectric thin film 15 and electrode 16, thereby creating the problem that a resonant frequency difference develops so as to cause the omission of vibration.

An object of the invention is to provide a piezoelectric tuning fork vibrator whose tuning fork legs to not differ in resonant frequency, is free from the omission of vibration, and has a high accuracy.

Another object of the invention is to provide a piezoelectric tuning fork vibrator which is capable of obtaining a high accuracy without using particular processing.

BRIEF DESCRIPTION OF THE DRAWINGS

These and other objects and features of the invention will become more apparent upon a reading of the following detailed description and the accompanying drawings in which.

DETAILED DESCRIPTION OF THE PREFERRED EMBODIMENT

Figure 1:
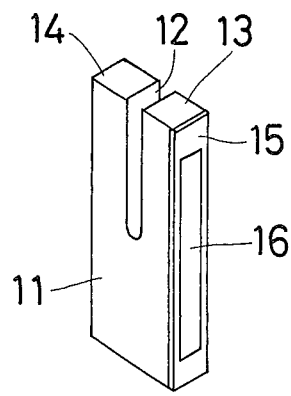
FIG. 1 is a perspective view of a conventional piezoelectric tuning fork vibrator.
Figure 2:
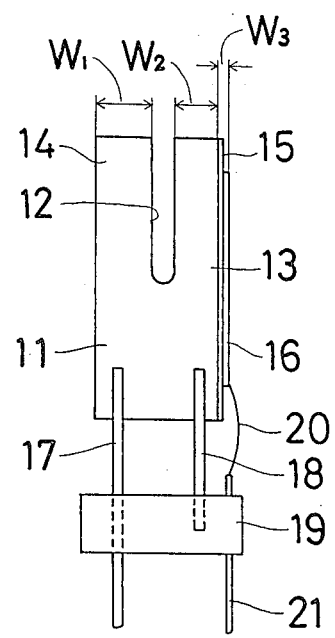
FIG. 2 is a front view of an embodiment of a piezoelectric tuning fork vibrator of the invention.
Figure 3:
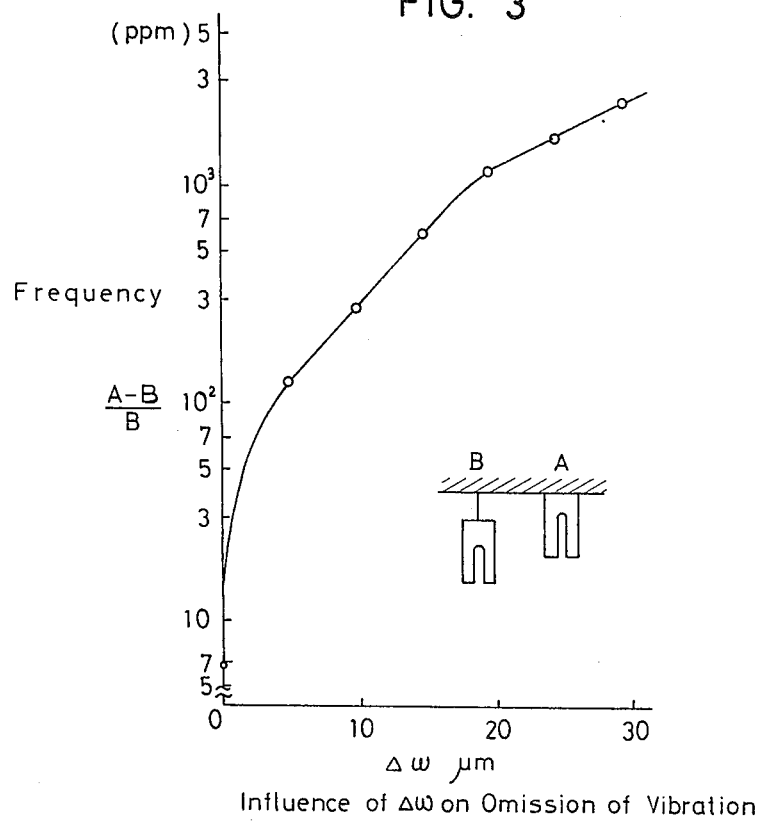
FIG. 3 is a graph showing the relation between the difference in the width of the tuning fork legs and the difference in the resonant frequency when the vibrator is free hanging and when the vibrator is fixed.

Referring to FIG. 2, the piezoelectric tuning fork vibrator is so constructed that a vibrator body 11 is provided with a slit 12 to form opposite tuning fork legs 13 and 14, one leg 13 being provided with a piezoelectric thin film 15 and an electrode 16, and a width $W_2$ of one leg 13 itself plus a thickness $W_3$ of the thin film 15 and electrode 16 being about equal to the width $W_1$ of the other leg 14.

In order to obtain the legs 13 and 14 having the above relation, the vibrator need only be machined in such a manner that the slit 12, when provided to form the legs 13 and 14, is positioned to make the width $W_2$ of one leg 13 smaller by the thickness $W_3$ of thin film 15 and electrode 16 than the width $W_1$ of the other leg 14.

Thus, the leg 13 which is machined with a smaller width or reduced in width during the machining, has its width increased by the thickness of piezoelectric thin film 15 and electrode 16 attached thereto, whereby the final legs 13 and 14 are about equal in width and the resonant frequencies thereof are equal so as to prevent omission of vibration at the tuning fork support portion.

As seen from the above, the piezoelectric fork vibrator of the invention provides opposite tuning fork legs at both sides, and one leg, including the piezoelectric thin film and electrode, is made about equal in width to the other leg, thereby equalizing the resonant frequencies of the legs and eliminating the occurrence of omission of vibration at the tuning fork support portion, thus providing an oscillator of high accuracy and free from characteristic variation.

While, an embodiment of the invention has been shown and described, the invention is not limited to the specific construction thereof, the embodiment being merely exemplary of the invention which is limited only by the appended claims.

What is claimed is:

1. A piezoelectric tuning fork vibrator comprising a vibrator body having two side-by-side tuning fork legs having respective widths $W_1$ and $W_2$, and a piezoelectric thin film and an electrode having a combined width $W_3$, mounted to the outside surface of the one of said legs having width $W_2$ so that said one of said legs and said piezoelectric thin film and electrode have a combined width of $W_2+W_3$, said combined width of $W_2+W_3$ being about equal to said width $W_1$ of the other of said legs, thereby eliminating leakage of vibration energy.

2. A piezoelectric tuning fork vibrator as in claim 1, wherein said vibrator body comprises a slit between said legs, the respective widths $W_1$ and $W_2$ of said tuning fork legs being determined by the position of said slit.

3. A piezoelectric tuning fork vibrator as in claim 1, wherein said vibrator body is formed of an elastically invariable material.

4. A piezoelectric tuning fork vibrator as in claim 3, wherein said material comprises elinvar.

* * * * *